(12) United States Patent
Jin

(10) Patent No.: US 6,458,708 B1
(45) Date of Patent: Oct. 1, 2002

(54) METHOD FOR FORMING METAL WIRING IN SEMICONDUCTOR DEVICE

(75) Inventor: Won Hwa Jin, Chungcheongbuk-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 43 days.

(21) Appl. No.: 09/644,840

(22) Filed: Aug. 24, 2000

(30) Foreign Application Priority Data

Aug. 25, 1999 (KR) .......................................... P99-35464

(51) Int. Cl.[7] ............................................. H01L 21/311
(52) U.S. Cl. .................. 438/703; 438/723; 438/743
(58) Field of Search ................................. 438/689, 690, 438/703, 706, 720, 723, 740, 743, 738

(56) References Cited

U.S. PATENT DOCUMENTS

| | | | | |
|---|---|---|---|---|
| 5,407,861 A | * | 4/1995 | Marangon et al. | 438/628 |
| 5,976,968 A | * | 11/1999 | Dai | 430/311 |
| 6,025,271 A | * | 2/2000 | Howard et al. | 438/697 |
| 6,146,995 A | * | 11/2000 | Ho | 438/626 |
| 6,239,022 B1 | * | 5/2001 | Seo et al. | 438/629 |

OTHER PUBLICATIONS

Integration of a W–plug Via in a SOG Etch Back Based IMO Process, VLSI Technology, Inc., Jun. 18–20, 1996 VMI Conference 1996 ISMIC., 106/96/0034(c).

* cited by examiner

Primary Examiner—Benjamin L. Utech
Assistant Examiner—Kin-chan Chen

(57) ABSTRACT

The present invention provides a method for forming metal wiring in a semiconductor device, which can improve a reliability of multilayered metal wiring. The process includes forming a first insulating structure on a semiconductor substrate, etching the first insulating film to form a first contact hole, forming a first plug in the first contact hole, and removing a portion of the first insulating structure to planarize the first plug and the remaining portion of the first insulating structure. A first wiring layer is formed on a portion of the first insulating film on and around the first plug. A second insulating structure is deposited on the first wiring layer and the first insulating structure and the second insulating structure is etched to create a via hole which exposes the first wiring layer. A second plug is created in the second contact hole and a portion of the second insulating film is removed to planarize the second plug and the remaining portion of the second insulating structure. A second wiring layer is subsequently fabricated on the second plug.

20 Claims, 13 Drawing Sheets

METHOD FOR FORMING METAL WIRING IN SEMICONDUCTOR DEVICE

BACKGROUND OF THE INVENTION

1. Field of the Invention

The present invention relates to a semiconductor device, and more particularly, to a method for forming a metal wiring in a semiconductor device, which can improve the reliability of multilayered metal wiring.

2. Background of the Related Art

As the packing density of semiconductor devices becomes higher, there have been many investigations into multilayered metal wiring. Multilayered metal wiring facilitates simple wiring design, setting of a wiring resistance, and selection of current capacity and the like in reserve. As a material for the multilayered wiring, aluminum and alloys of aluminum are widely used; these materials possess good electric conductivity and are low cost. Additionally, a plug layer of tungsten having a good contact resistance is employed primarily for bringing an upper wiring and a lower wiring into contact as the packing density of semiconductor devices increases.

A related art multilayered metal wiring will be explained with reference to the attached drawings. FIG. 1 illustrates a section of a related art multilayered metal wiring in a semiconductor device, and FIGS. 2A–2L illustrate sections showing the steps of a related art method for forming multilayered metal wiring in a semiconductor device.

A structure of the related art multilayered metal wiring in a semiconductor device will be explained. The related art multilayered metal wiring in a semiconductor device is provided with a first interlayer insulating film 22 having a contact hole formed on a semiconductor substrate 21, an adhesive/barrier layer 24 at the bottom and sides of the contact hole excluding an upper portion of the contact hole, a tungsten plug layer 26 formed in the contact hole excluding the upper portion of the contact hole, an adhesive layer 27 formed on the tungsten plug layer 26 in the upper portion of the contact hole and a first wiring layer 29 formed on the interlayer insulating film 22. A portion of first wiring layer 29 fills the upper portion of the contact hole on the adhesive layer 27 with a depression at a center.

A second interlayer insulating film 30 having a via hole exposes a portion of the first wiring layer 29 formed on the first interlayer insulating film 22 and an adhesive/barrier layer 31 is formed on a bottom surface (an upper surface of the first wiring layer) and side surfaces of the via hole excluding an upper portion of the via hole. A tungsten plug layer 33 fills the via hole excluding the upper portion of the via hole, and a second wiring layer 34 in contact with the tungsten plug layer 33 formed on the second interlayer insulating film 30 inclusive of the upper portion of the via hole with a depression at a center thereof. Centers of the first and second wiring layers 29 and 34 are depressed because there are tungsten recesses formed when the underlying tungsten plug layers 26 and 33 are formed.

The steps of a related art method for forming multilayered metal wiring in a semiconductor device having the aforementioned structure will be explained.

Referring to FIG. 2A, a first interlayer insulating film 22 is formed on an entire surface of a semiconductor substrate 21 having cell transistors (not shown) and the like formed thereon. As shown in FIG. 2B, the first interlayer insulating film 22 is etched selectively, to form a contact hole 23, which exposes a surface of the semiconductor substrate 21, selectively. Then, as shown in FIG. 2C, an adhesive/barrier layer 24 is formed on an entire surface inclusive of the contact hole 23. The adhesive layer is formed for enhancing an adhesive force between the material layer for forming the plug, and the substrate and the contact hole in a following process for forming the plug while the barrier layer is formed for use as a diffusion barrier. Then, as shown in FIG. 2D, a tungsten film 25 is formed by CVD (Chemical Vapor Deposition), to fill the contact hole 23, completely.

As shown in FIG. 2E, the tungsten film 25 is etched back until an upper surface of the first interlayer insulating film 22 inclusive of the contact hole 23 is exposed, to form a tungsten plug layer 26. In this instance, the tungsten layer in the contact hole 23 is recessed. Then, as shown in FIG. 2F, an adhesive layer 27 is formed for enhancing an adhesive force. Then, as shown in FIG. 2G, a material layer 28 for forming wiring is formed on the adhesive layer 27. As shown in FIG. 2H, the material layer 28 for forming wiring and the adhesive layer 27 are etched selectively by photolithography to form a first wiring layer 29.

Subsequently, as shown in FIG. 2I, a second interlayer insulating film 30 is formed on the first wiring layer 29 and the first interlayer insulating film 22. As shown in FIG. 2J, the second interlayer insulating film 30 is removed selectively, to form a via hole to expose the first wiring layer 29. An adhesive/barrier layer 31 is formed on an entire surface of the second interlayer insulating film 30 inclusive of the via hole, and a tungsten film 32 is deposited by CVD on an entire surface. Then, as shown in FIG. 2K, the tungsten film 32 is etched back to expose an upper surface of the second interlayer insulating film 30, to form a tungsten plug layer 33. In this instance too, the tungsten layer in the via hole is depressed. As shown in FIG. 2L, a material layer for forming wiring is formed on an entire surface inclusive of the tungsten plug layer 33 and etched selectively, to form a second wiring layer 34. Such a method of forming a wiring by stacking via holes is a method for forming a wiring that is useful as device packing density increases, a process generally used in a logic circuit using multilayered wiring having more than 4 layers.

However, the etch back process in formation of the tungsten plug layer in such a stacked via structure is not conducive to actual mass production, because the CMP (Chemical Mechanical Polishing) used in the mass production has a high cost. Nevertheless, the etch back process can not be used because a section of the metal wiring in contact with the plug layer can not maintain a rectangular form due to the depression formed in the plug layer when the plug layer is formed by etch back.

The related art multilayered metal wiring in a semiconductor device has the following problems. The depression formed in the tungsten layer in the contact/via hole region during formation of a tungsten plug layer impedes formation of metal wiring with a rectangular cross-section. This feature impedes formation of a via hole for forming an upper wiring in a subsequent process, and leads to creation of unstable forms of the barrier layer and the plug layer which are deposited after the formation of the via hole. Such a structure causes partial increase of a current density in operation of the device, deteriorating a device reliability and yield. Thus, in formation of multilayered wiring of a stacked via type, the formation of plug layer by etch back can not be applied to actual mass production due to the foregoing problems.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Accordingly, the present invention is directed to a method for forming a metal wiring in a semiconductor device that substantially obviates one or more of the problems due to limitations and disadvantages of the related art.

An object of the present invention is to provide a method for forming a metal wiring in a semiconductor device, which can improve a reliability of multilayered metal wiring and simplify the forming process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming a metal wiring in a semiconductor device includes the steps of (1) forming a first insulating film on a semiconductor substrate, (2) etching the first insulating film to form a first contact hole, (3) forming a first plug in the first contact hole, and removing a portion of the first insulating film for planarizing the first plug and the first insulating film, (4) forming a first wiring layer on a portion of the first insulating film on and around the first plug, (5) forming a second insulating film on the first wiring layer and the first insulating film, (6) etching the second insulating film for forming a second contact hole which exposes the first wiring layer, (7) forming a second plug in the second contact hole and removing a portion of the second insulating film, for planarizing the second plug and the second insulating film, and (8) forming a second wiring layer on the second plug.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
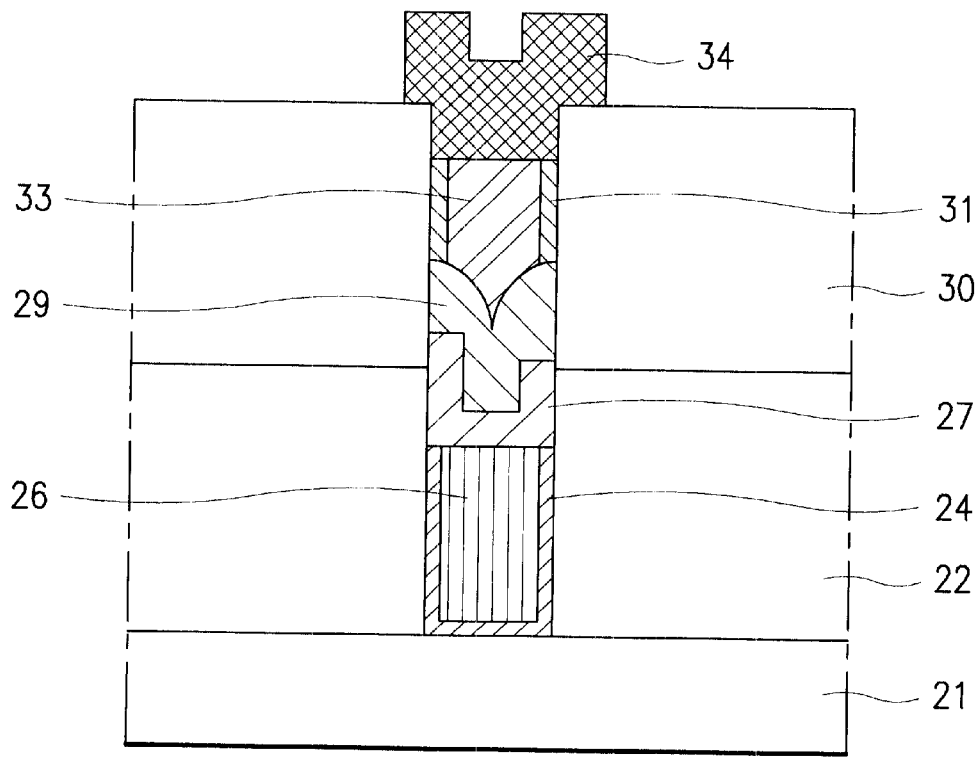
FIG. 1 illustrates a cross-section of a related art multilayered metal wiring in a semiconductor device.
Figure 2A:
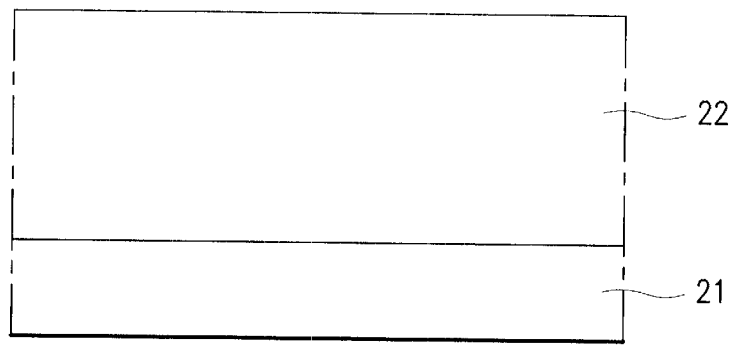
FIGS. 2A–2L illustrate cross-sections showing the steps of a related art method for forming multilayered metal wiring in a semiconductor device.
Figure 2B:
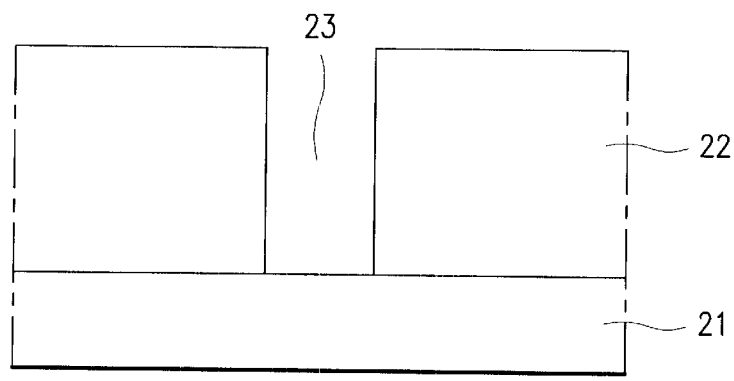
Figure 2C:
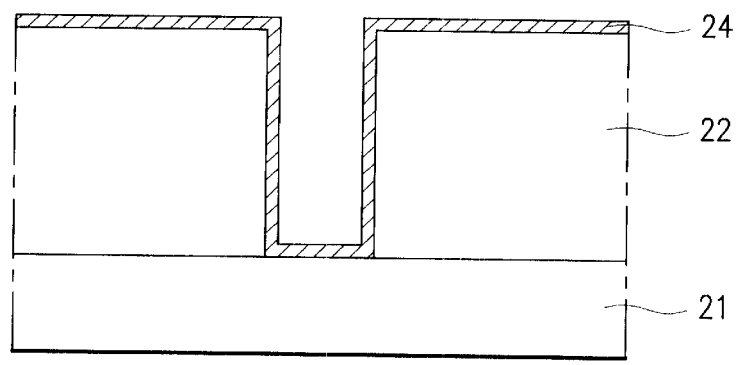
Figure 2D:
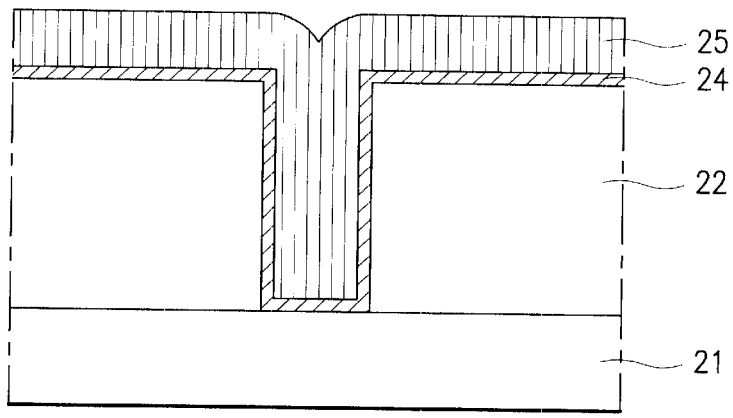
Figure 2E:
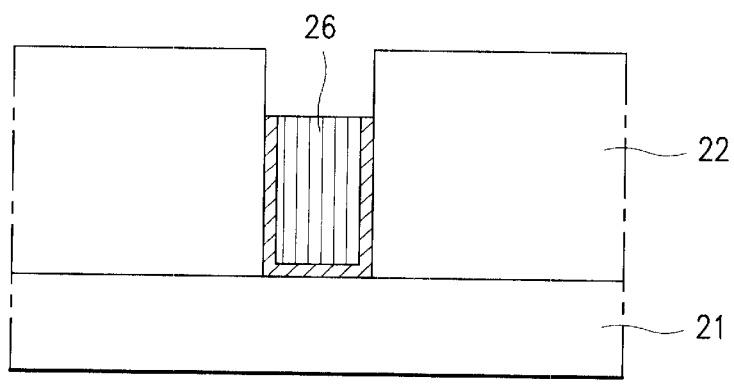
Figure 2F:
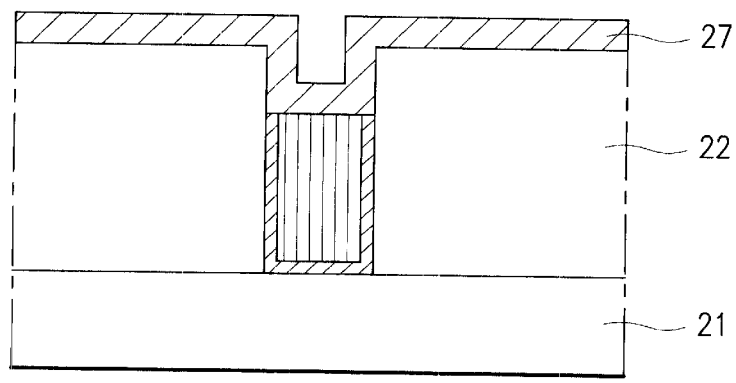
Figure 2G:
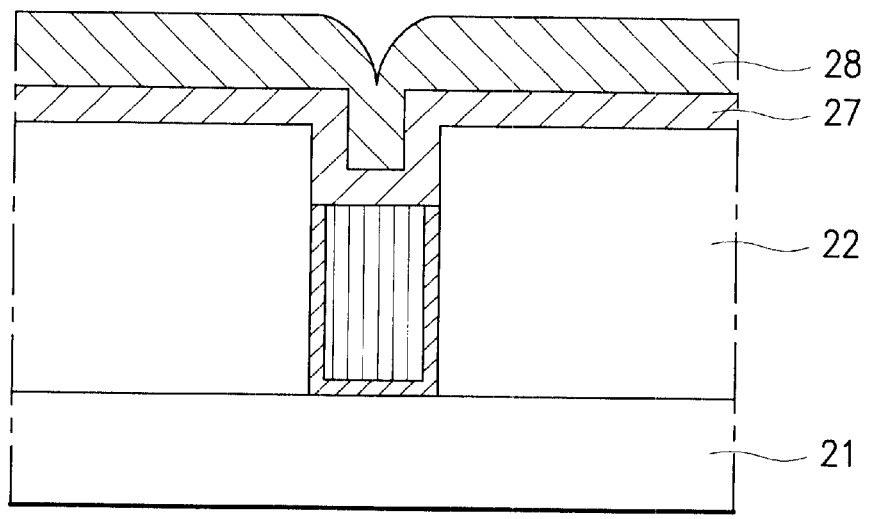
Figure 2H:
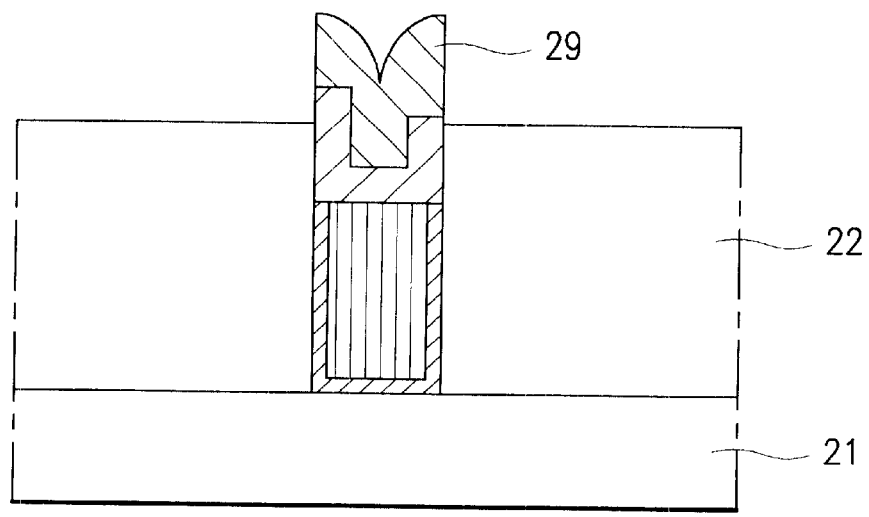
Figure 2I:
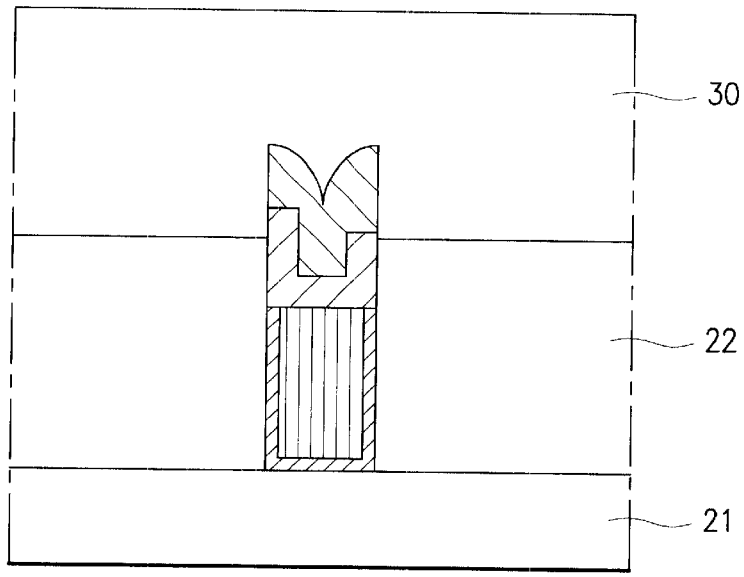
Figure 2J:
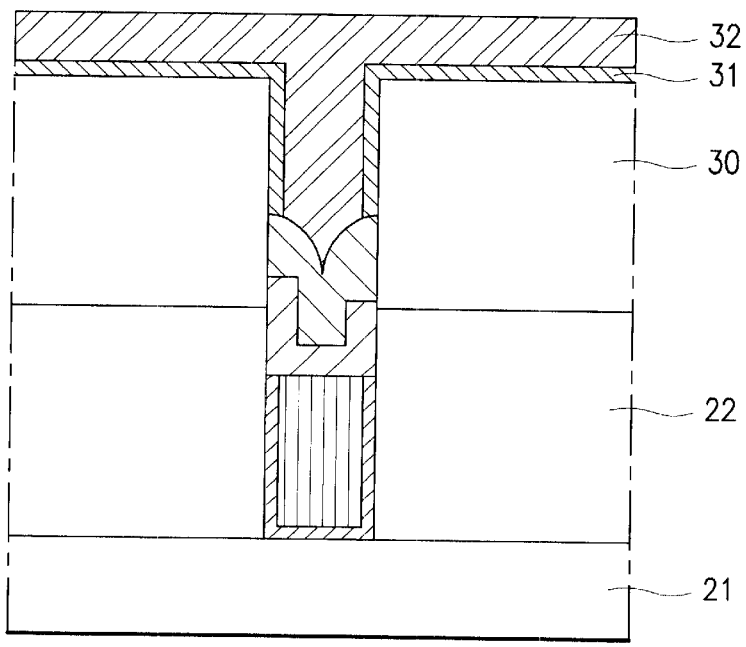
Figure 2K:
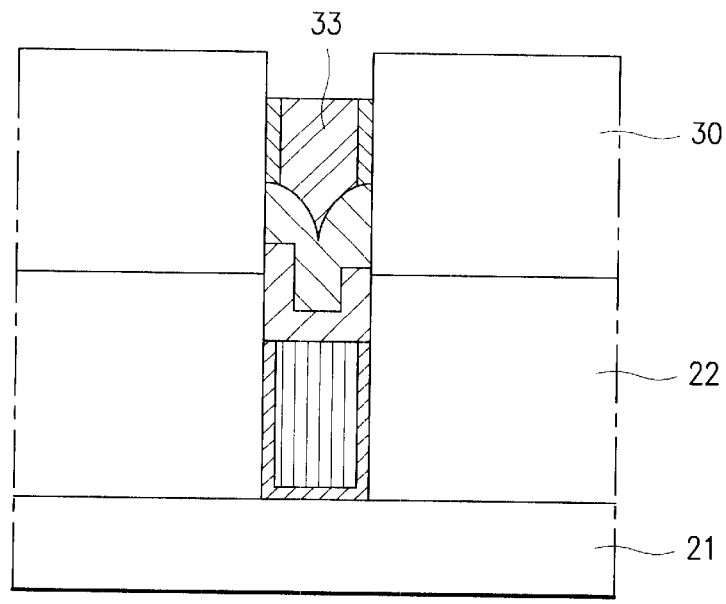
Figure 2L:
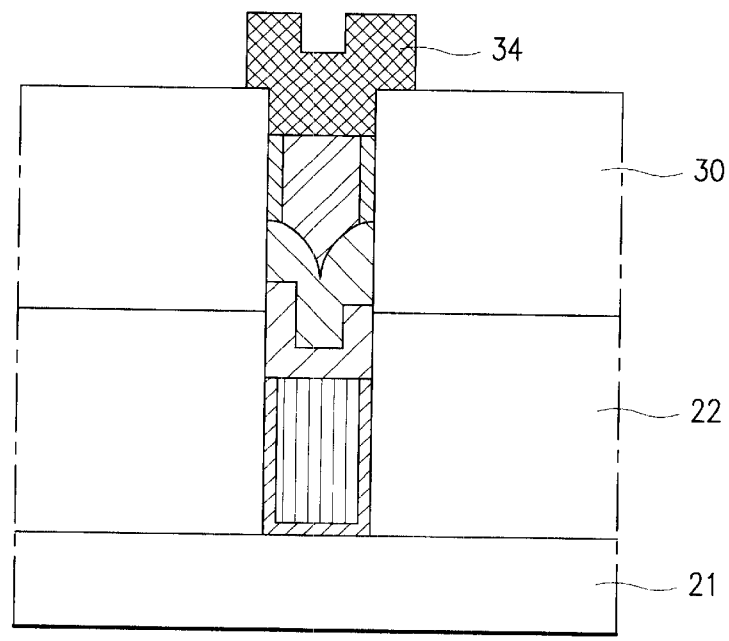
Figure 3:
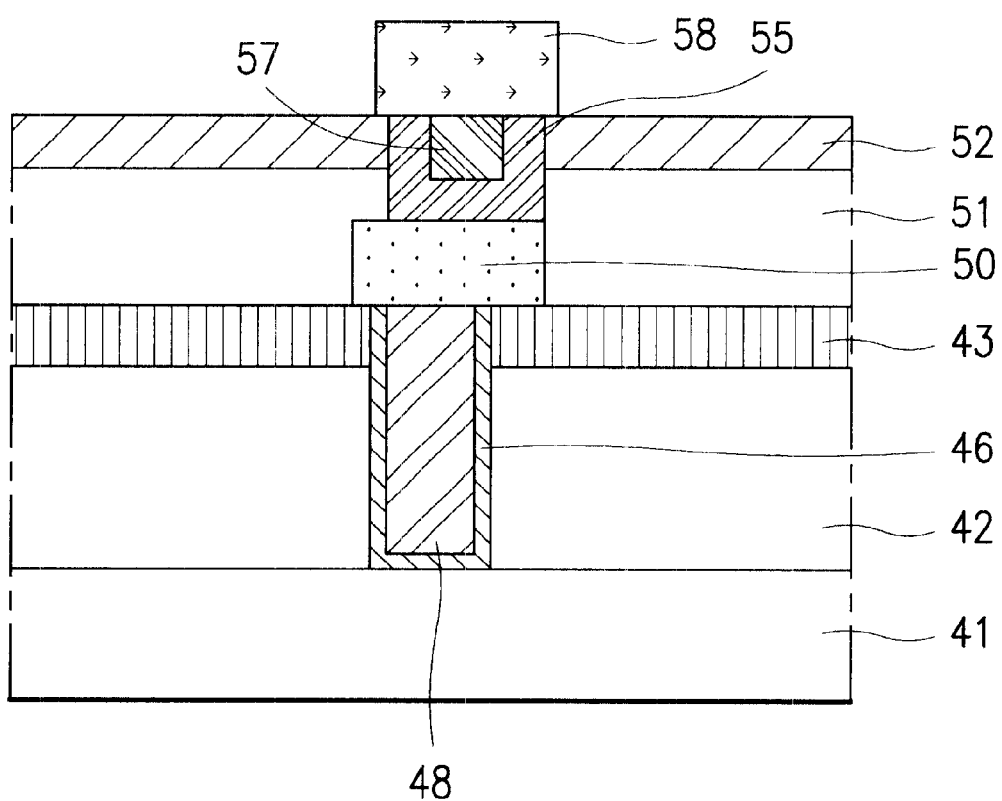
FIG. 3 illustrates a cross-section of a multilayered metal wiring in a semiconductor device in accordance with a preferred embodiment of the present invention; and, FIGS. 4A–4N illustrate cross-sections showing the steps of a method for forming multilayered metal wiring in a semiconductor device in accordance with a preferred embodiment of the present invention.

Reference will now be made in detail to the preferred embodiments of the present invention, examples of which are illustrated in the accompanying drawings. FIG. 3 illustrates a section of a multilayered metal wiring in a semiconductor device in accordance with a preferred embodiment of the present invention.

Referring to FIG. 3, the multilayered metal wiring in a semiconductor device in accordance with a preferred embodiment of the present invention includes a first interlayer insulating film 42 and etch stopping layer 43 having a contact hole formed on a semiconductor substrate 41 in succession, an adhesive/barrier layer 46 formed on an entire bottom and side surfaces of the contact hole, a tungsten plug layer 48 filling an entire contact hole, a first wiring layer 50 formed on the etch stopping layer 43 inclusive of the tungsten plug layer 48, a second interlayer insulating film 51 and an etch stopping layer 52 formed on the etch stopping layer 43 in succession with a via hole to expose a portion of the first wiring layer 29, an adhesive/barrier layer 55 formed on entire bottom and side surfaces of the via hole, a tungsten plug layer 57 filling the via hole completely, a second wiring layer 58 in contact with the tungsten plug layer 57 formed on the etch stopping layer 52. Thus, the first, and second wiring layers 50 and 58 can be formed uniformly with rectangular sections because heights of a top edge portion of the contact hole and the plug layer are made substantially coplanar by forming an initial contact hole (or via hole) taking a thickness at which the depression in the tungsten occurs into consideration when forming tungsten plugs 48 and 57, and removing a sacrificial insulating layer at a top of the contact hole (or via hole) after the etch back of the tungsten film.

Figure 4A:
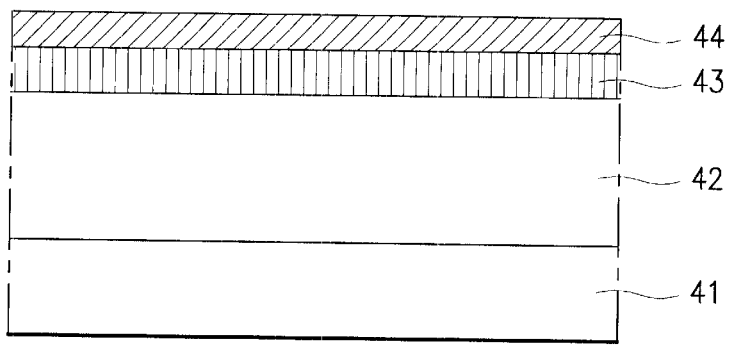

A method for forming multilayered metal wiring in a semiconductor device in accordance with a preferred embodiment of the present invention will be explained. FIGS. 4A–4N illustrate sections showing the steps of a method for forming multilayered metal wiring in a semiconductor device in accordance with a preferred embodiment of the present invention.

Referring to FIGS. 4A, the method for forming multilayered metal wiring in a semiconductor device in accordance with a preferred embodiment of the present invention starts with forming a first interlayer insulating film 42, an etch stopping layer 43, and a sacrificial insulating layer 44 on a semiconductor substrate 41 having cell transistors (not shown) or other semiconductor devices formed thereon in succession. First interlayer insulating film 42, etch stop layer 43, and sacrificial insulating layer 44 collectively form a first insulating structure on the substrate 41. The etch stopping layer 43 is formed to have a thickness of approximately 100~200Å, and a thickness of the sacrificial insulating layer 44 is determined by taking a tungsten depression into consideration (e.g., determining the depth of the tungsten depression and ensuring a sufficient thickness for layer 44 such that removal of sacrificial layer 44 results in a substantially coplanar tungsten/etch stop layer interface following formation of a tungsten plug layer. It is noted that tungsten is an exemplary material for the plug layer; other conductors are also suitable for use as the plug.

Figure 4B:
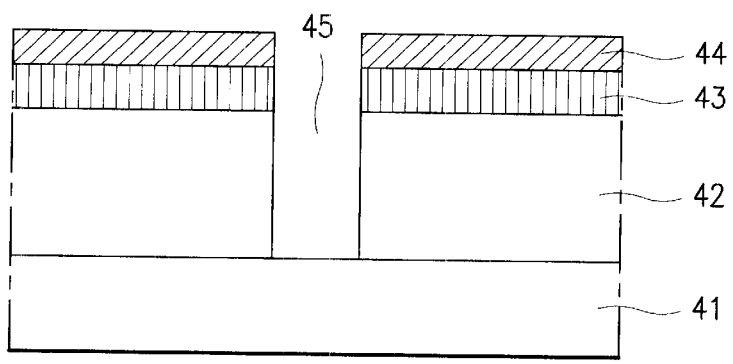
Figure 4C:
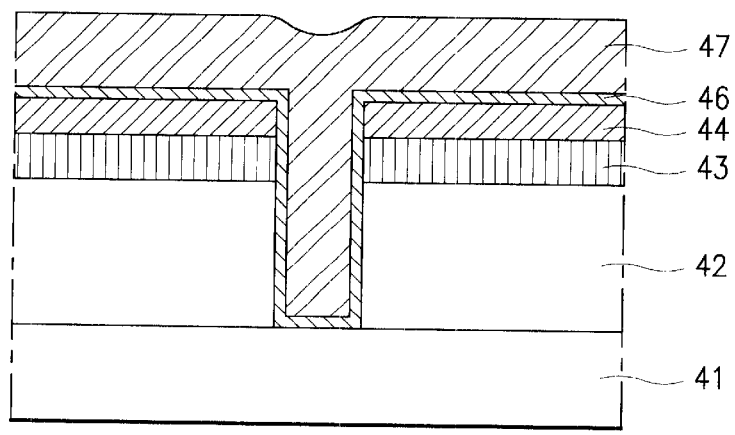

As shown in FIG. 4B, the first interlayer insulating film 42, the etch stopping layer 43, and the sacrificial insulating layer 44 are etched selectively by photolithography to form a contact hole 45, to expose a surface of the semiconductor substrate 41, selectively. Then, as shown in FIG. 4C, an adhesive/barrier layer 46 is formed on an entire surface inclusive of the contact hole 45. The adhesive layer is formed for enhancing an adhesive force between a material layer for forming a plug and the substrate and the contact hole in a following plug formation, and the barrier layer is formed for use as a diffusion barrier. In an exemplary embodiment, the adhesive layer is selected to be of Ti which may be deposited, for example, by sputtering or CVD. The barrier layer in an exemplary embodiment comprises TiN which may be deposited by sputtering or may be one of TiN, TaN, or WN formed by CVD or other known deposition techniques. Then, a tungsten film 47 is deposited by CVD to fill the contact hole 45, completely.

Figure 4D:
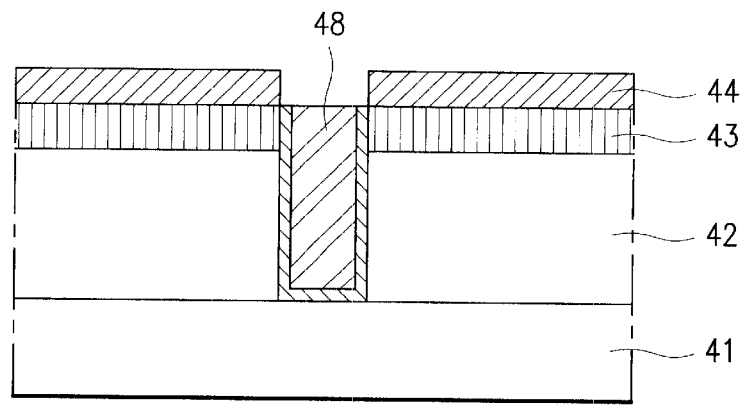
Figure 4E:
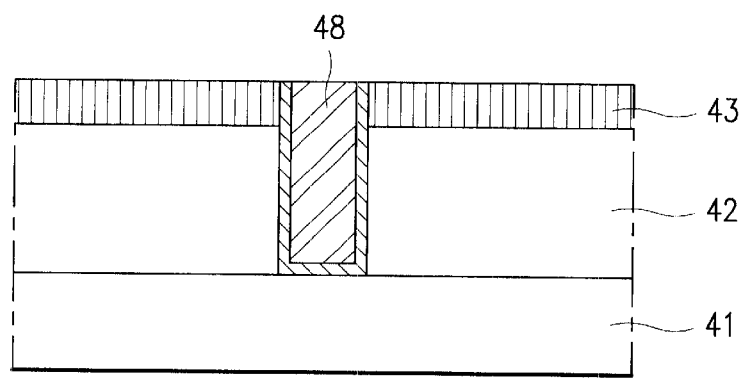

As shown in FIG. 4D, the tungsten film 47 is etched back until a top surface of the sacrificial insulating film 44 is exposed, to form a tungsten plug layer 48. In this instance, the tungsten layer in the contact hole 45 is depressed to a depth similar to a thickness of the sacrificial insulating film 44. As shown in FIG. 4E, the sacrificial insulating film 44 is removed by any desired wet or dry etching technique as is known in the art and using the etch stopping layer 42 as the endpoint. Because the tungsten layer in the contact hole is depressed to a depth similar to the sacrificed layer thickness, upon removal of the sacrificial layer, the plug layer 48 and the etch stop layer 43 are substantially coplanar, i.e., their surfaces are substantially flush.

Figure 4F:
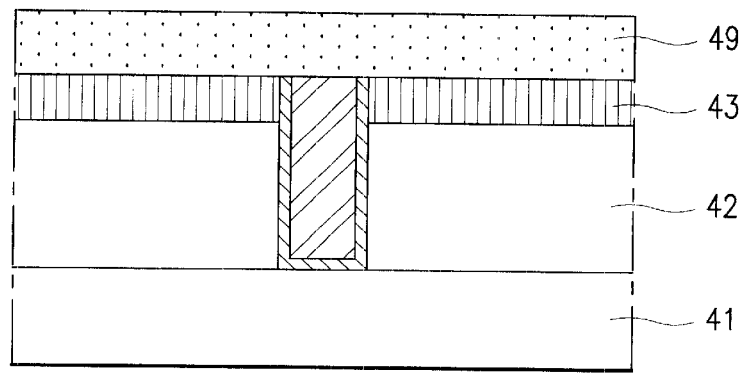
Figure 4G:
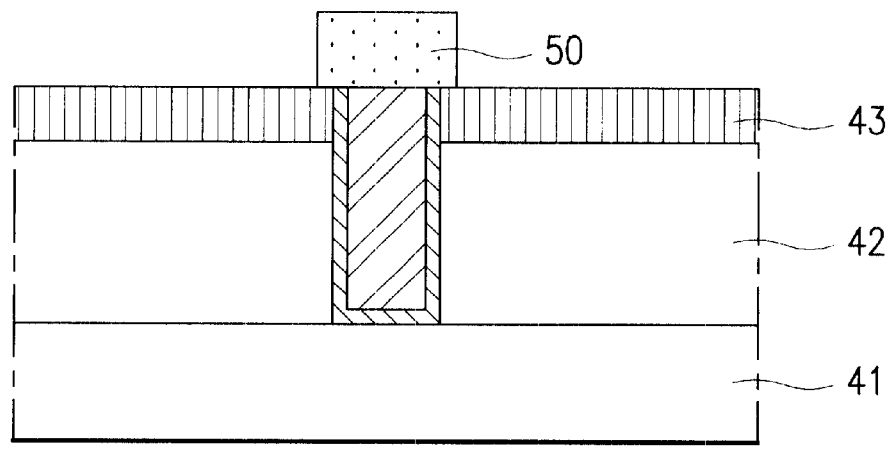
Figure 4H:
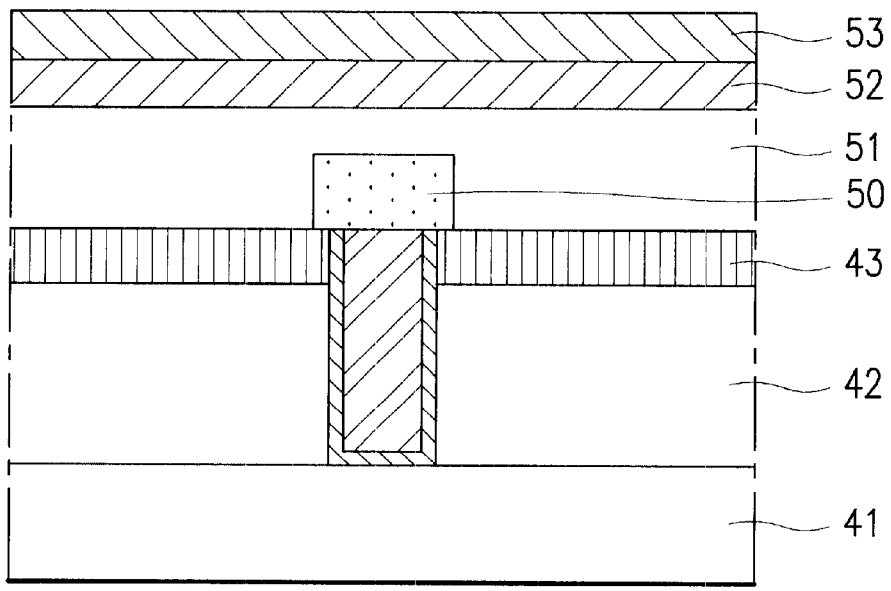

As shown in FIG. 4F, a material layer 49 for forming wiring is deposited on an entire surface inclusive of the tungsten plug layer 48. Subsequently, as shown in FIG. 4G, the material layer 49 for forming wiring is etched selectively, to form a first wiring layer 50. As shown in FIG. 4H, a second interlayer insulating film 51, an etch stopping layer 52, and a sacrificial insulating film 53 are formed in succession on the first wiring layer 50 and the etch stopping layer 43 in succession. The second interlayer insulating film 51, etch stop layer 52, and sacrificial insulating film 53 collectively form a second insulating structure.

Figure 4I:
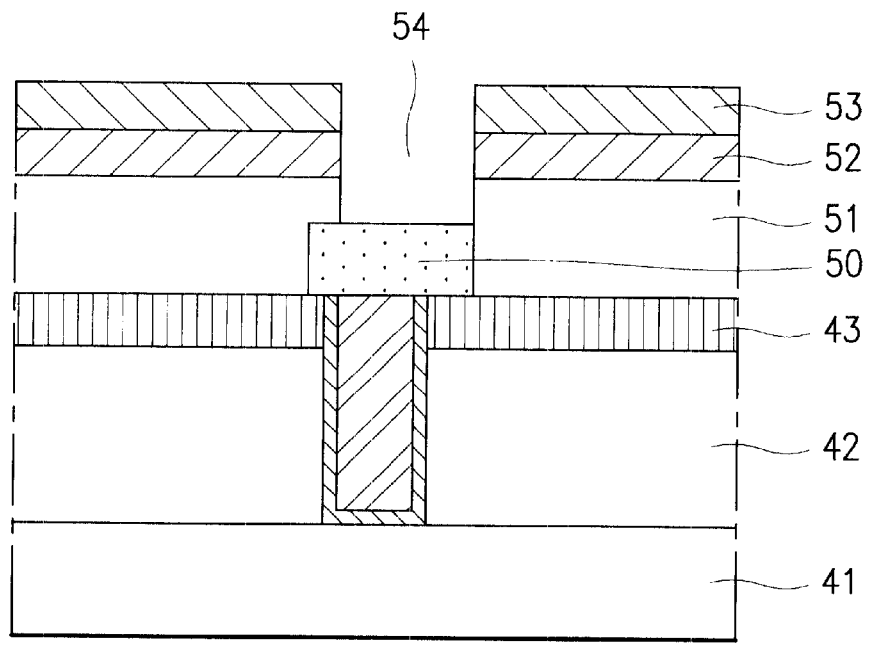
Figure 4J:
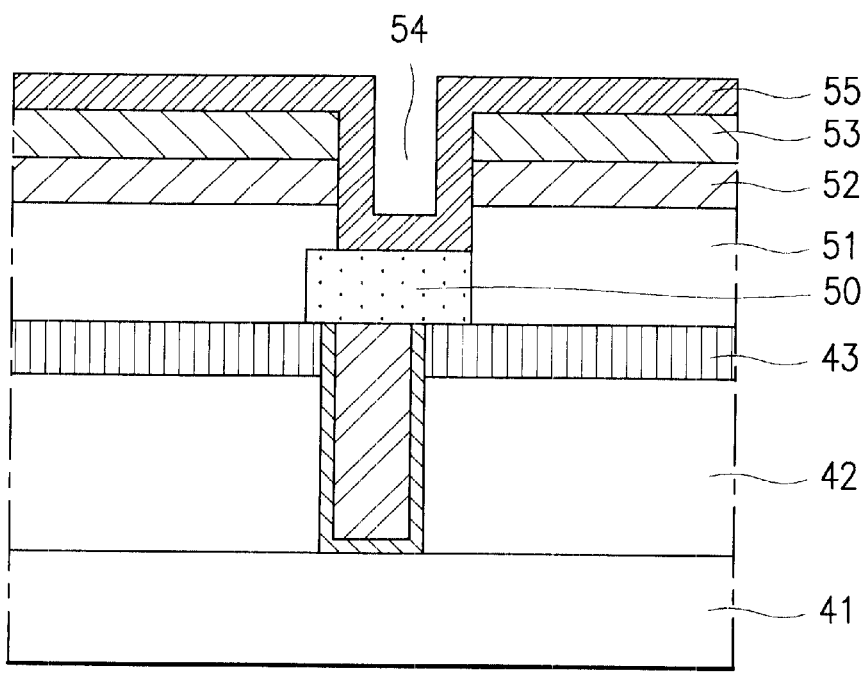
Figure 4K:
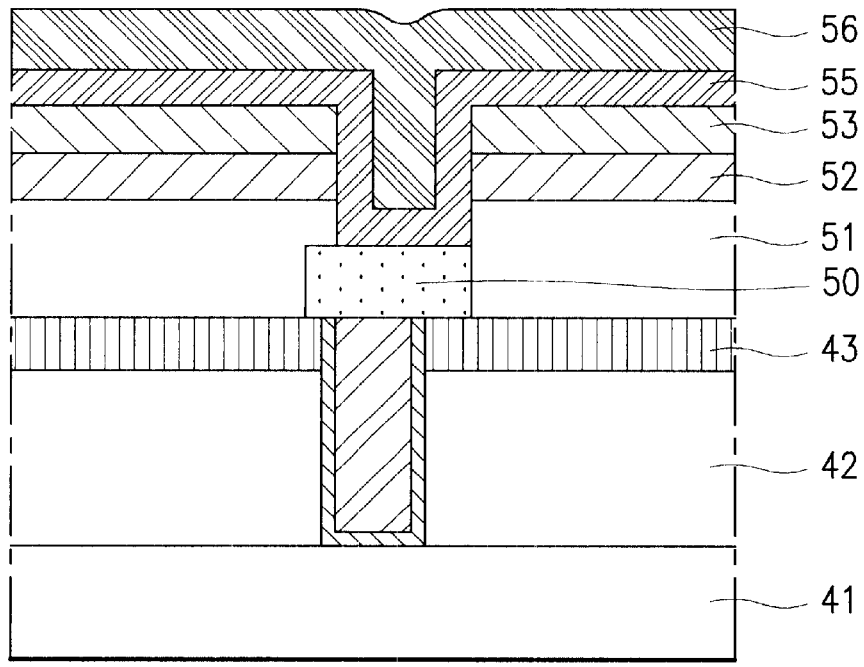

As shown in FIG. 4I, the second interlayer insulating film 51, the etch stopping layer 52, and the sacrificial insulating film 53 are removed selectively, to form a via hole 54 to expose the first wiring layer 50. Then, as shown in FIG. 4J, an optional adhesive/barrier layer 55 is formed on an entire surface of the sacrificial insulating film 53 inclusive of the via hole. As shown in FIG. 4K, a tungsten film 56 is deposited on an entire surface by CVD. As discussed previously, while tungsten is described in this exemplary embodiment, other conductors, e.g., other refractory metals and/or compounds or other compatible conductors may be selected for the plug layer as is known in the art.

Figure 4L:
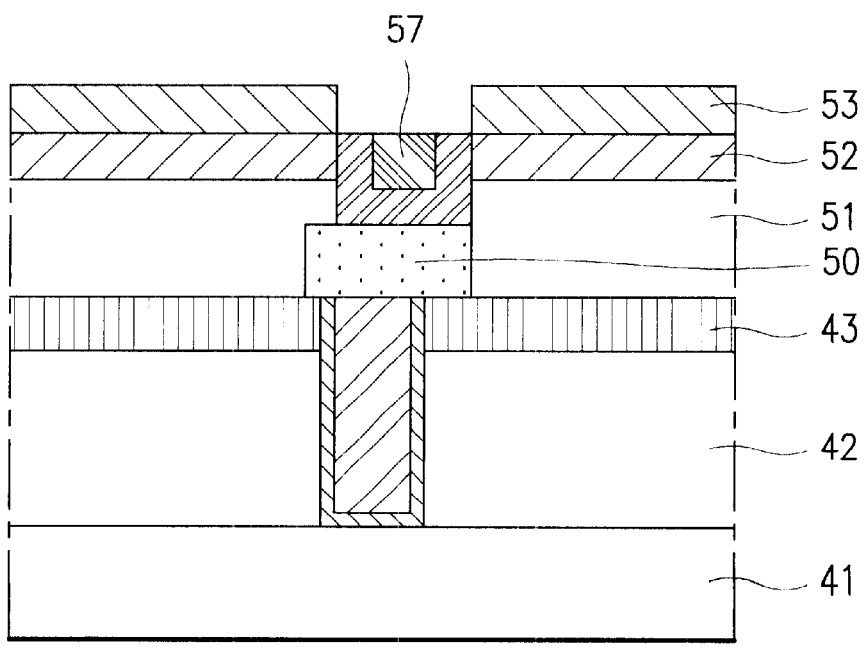
Figure 4M:
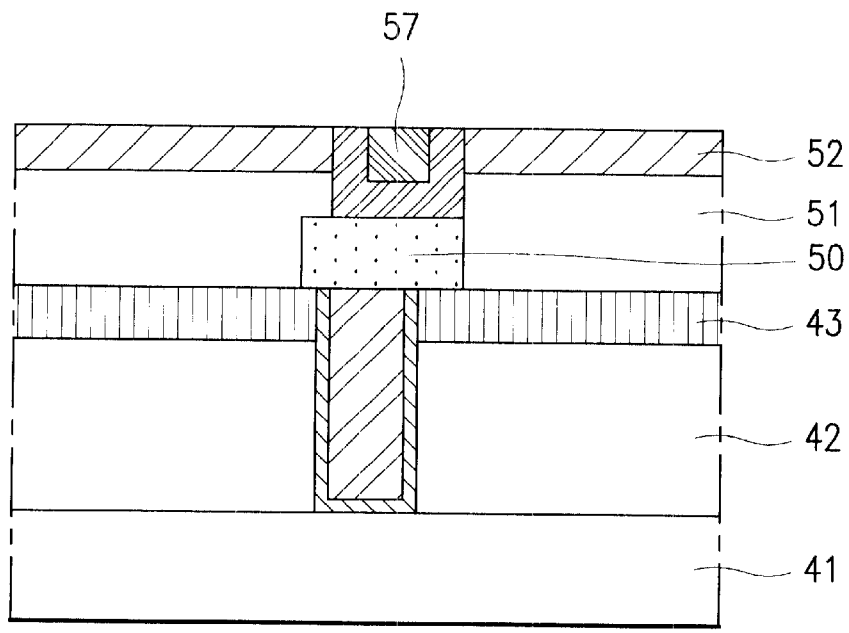
Figure 4N:
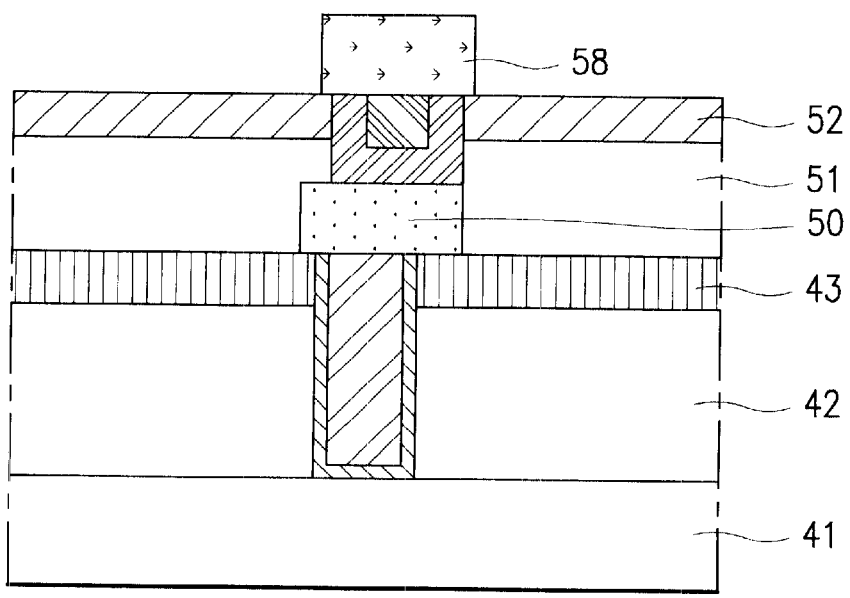

As shown in FIG. 4L, the tungsten film 56 is etched back until a top surface of the sacrificial insulating film 53 is exposed, to form a tungsten plug layer 57. In this instance too, the tungsten layer in the via hole is depressed. An amount of the depression of the tungsten layer caused by the etch back varies not so much with process conditions, but is almost constant. Then, as shown in FIG. 4M, the etch stopping layer 52 is used in removing the sacrificial insulating film 53 leaving a tungsten plug layer 57 substantially coplanar with the surface of etch stop layer 52. As shown in FIG. 4N, a material layer for forming wiring is formed on an entire surface inclusive of the tungsten plug layer 57, and etched selectively, to form a second wiring layer 58.

Thus, the method for forming a metal wiring in a semiconductor device according to the present invention can solve the problem of formation of non-uniform metal wiring caused by the depression of tungsten film coming from etch back in formation of plug layer. As seen from the previous description of the exemplary embodiments, the method for forming a metal wiring in a semiconductor device has the following advantages. Metal wiring can be uniformly formed by a process in which the plug layer and the interlayer insulating layer are planarized by using a sacrificial insulating film whose thickness compensates for the depression of the plug layer in a contact/via hole region. The uniform metal wiring simplifies formation of a via hole for overlying wiring in a subsequent process, and also permits the barrier layer and the plug layer deposited after formation of the via hole to have a stable form. Accordingly, the method for forming a metal wiring in a semiconductor device of the present invention improves device reliability and yield by preventing a partial current density increase during operation of the device.

Further, the method for forming metal wiring in a semiconductor device according to the present invention is favorable in view of the low cost and applicability to actual mass production in formation of the stacked via type multilayered wiring. Consequently, the present invention advantageously provides a process for creating a plug layer having the same uniformity as the chemical-mechanical polishing (CMP) process without the expense and low yield of the CMP process.

It will be apparent to those skilled in the art that various modifications and variations can be made in the method for forming a metal wiring in a semiconductor device of the present invention without departing from the spirit or scope of the invention. For example, as discussed above, the materials of the individual process layers are exemplary; any functionally equivalent material may be selected for a given device layer and is therefore contemplated for use in the present invention. Thus, it is intended that the present invention cover the modifications and variations of this invention provided they come within the scope of the appended claims and their equivalents.

What is claimed is:

1. A method for forming metal wiring in a semiconductor device, comprising:

forming a first insulating structure comprising plural layers on a semiconductor substrate;

etching the first insulating film to form a first contact hole;

forming a first plug in the first contact hole, and removing at least a portion of one of the plural layers of the first insulating structure for planarizing the surface of the first plug and a remaining portion of the first insulating structure;

forming a first wiring layer on at least a portion of the remaining portion of the first insulating structure on and around the first plug;

forming a second insulating structure comprising plural layers on the first wiring layer and the first insulating structure;

etching the second insulating structure for forming a second contact hole which exposes the first wiring layer;

forming a second plug in the second contact hole and removing a portion of the second insulating structure, for planarizing the second plug and a remaining portion of the second insulating structure; and, forming a second wiring layer on the second plug.

2. A method as claimed in claim 1, wherein the first and second plugs are formed of tungsten.

3. A method as claimed in claim 1, wherein the first and second insulating structures are each formed by depositing an interlayer insulating film, an etch stopping layer and a sacrificial insulating layer in succession, and a sacrificial insulating film is removed when planarizing the first plug and the remaining portion of the first insulating structure and when planarizing the second plug and the remaining portion of the second insulating structure, wherein a top surface of the first wiring layer is substantially coplanar with a top surface of the etch stopping layer of the first insulating structure, and wherein a top surface of the second wiring layer is substantially coplanar with a top surface of the etch stopping layer of the second insulating structure.

4. A method as claimed in claim 3, wherein the sacrificial insulating layer is formed to a thickness the same as a thickness of a depression created in a material layer deposited for forming a first plug in a step of etching back the material layer for forming the first plug.

5. A method as claimed in claim 1, further comprising etching the first wiring layer to a rectangular shape on and around the first plug, wherein the first contact hole is in contact with the first wiring layer and the semiconductor substrate.

6. A method as claimed in claim 1, wherein at most half of the first wiring layer is formed on the first etch stopping layer, and wherein at most half of the second wiring layer is formed on the second etch stopping layer.

7. A method for forming a metal wiring in a semiconductor device, comprising:
  forming a first interlayer insulating film, a first etch stopping layer, and a first sacrificial insulating layer on an entire surface of a semiconductor substrate and etching to form a contact hole;
  forming a first tungsten film to fill the contact hole, and etching back to form a first tungsten plug;
  removing the first sacrificial insulating film by using the first etch stopping layer such that an upper surface of the first plug is substantially coplanar with an upper surface of the first etch stopping layer, and forming a first wiring layer in contact with the first tungsten plug layer and the first etch stopping layer;
  forming a second interlayer insulating film, a second etch stopping layer, and a second sacrificial insulating layer on a surface including the first wiring layer and forming a via hole to expose the first wiring layer;
  forming a second tungsten film in the via hole and etching back to form a second tungsten plug layer; and,
  removing the second sacrificial insulating film by using the second etch stopping layer such that a surface of the second tungsten plug is substantially coplanar with a surface of the second etch stopping layer, and forming a second wiring layer in contact with the second tungsten plug layer and the second etch stopping layer.

8. A method as claimed in claim 7, wherein a thickness of the first tungsten film is depressed in the plug forming region during etch back of the first tungsten film and a thickness of the first sacrificial insulating film is selected to correspond to a thickness of a depressed portion of the first tungsten film.

9. A method as claimed in claim 7, wherein the first and second etch stopping layers are formed to a thickness of 100~200 Å.

10. A method as claimed in claim 7, wherein the first and second tungsten films are deposited by CVD.

11. A method as claimed in claim 7, wherein an adhesive layer and a barrier layer are formed on a bottom surface and a side surface of the contact hole before formation of the first tungsten film.

12. A method as claimed in claim 11, wherein the adhesive layer is formed by depositing Ti by sputtering or chemical vapor deposition.

13. A method as claimed in claim 11, wherein the barrier layer is formed by depositing TiN by sputtering, or by depositing one of TiN, TaN or WN by chemical vapor deposition.

14. A method as claimed in claim 7, wherein an adhesive layer and a barrier layer are formed on a bottom surface and a side surface of the via hole before formation of the second tungsten film.

15. A method as claimed in claim 8, where in the adhesive layer is formed by depositing Ti by sputtering or chemical vapor deposition.

16. A method as claimed in claim 14, wherein the barrier layer is formed by depositing TiN by sputtering or by depositing one of TiN, TaN, or WN by chemical vapor deposition.

17. A method as claimed in claim 7, further comprising etching the first wiring layer to a rectangular shape on and around the first plug, wherein the first contact hole is in contact with the first wiring layer and the semiconductor substrate.

18. A method as claimed in claim 17, wherein at most half of the first wiring layer is formed on the first etch stopping layer and wherein at most half of the second wiring layer is formed on the second etch stopping layer.

19. A method of forming a multilayered metal wiring in a semiconductor device, comprising:
  forming a first insulating structure including a first etch stopping layer;
  etching the first insulating structure to form a first contact hole;
  forming a first plug in the first contact hole;
  planarizing the first plug and the first insulating structure, wherein a top surface of the first plug and a top surface of the first etch stopping layer are substantially coplanar;
  forming a first wiring layer on the top surface of the first plug and the top surface of the first etch stopping layer, wherein a minority of the first wiring layer is formed on the first etch stopping layer;
  forming a second insulating structure including a second etch stopping layer;
  etching the second insulating structure to form a second contact hole which exposes the first wiring layer;
  forming a second plug in the second contact hole;
  planarizing the second plug and the second insulating structure, wherein a top surface of the second plug and a top surface of the second etch stopping layer are substantially coplanar; and
  forming a second wiring layer on the second plug and the second etch stopping layer, wherein a minority of the second wiring layer is formed on the second etch stopping layer.

20. A method as claimed in claim 19, wherein the first and second wiring layers are rectangular shaped and the surfaces of the first and second wiring layers that contact the first and second etch stopping layers are less wide than the surfaces of the first and second wiring layers that contact the first and second contact holes.

* * * * *